INVENTORS
WILLIAM H. TOOMEY
JOHN W. TOOMEY

INVENTORS
WILLIAM H. TOOMEY
JOHN W. TOOMEY

United States Patent Office 3,434,208
Patented Mar. 25, 1969

3,434,208

CIRCUIT ASSEMBLY PROCESS

William H. Toomey, 3532 Mentone Ave., Los Angeles, Calif. 90034, and John W. Toomey, 18349 Chatsworth St., Northridge, Calif. 91324

Continuation of application Ser. No. 445,067, Apr. 2, 1965, now abandoned, which is a division of application Ser. No. 134,248, Aug. 28, 1961, now abandoned. This application Dec. 16, 1966, Ser. No. 602,298
Int. Cl. H05k *3/30;* B44d *1/18*
U.S. Cl. 29—626 5 Claims

ABSTRACT OF THE DISCLOSURE

A method of fabricating printed electronic circuit electrical connections wherein a resilient male mold is formed with protrusions where electrical connections are desired; the circuit is deposited on the male mold, covering the protrusions; the conductive material on the ends of the protrusion is removed; the circuit including the protrusions is removed from the male mold and adhered to a suitable backing; holes are drilled or punched through the backing under the protrusions; and individual module plates are separated by shearing. Conductive leads, as from components, are inserted in the protrusions and are electrically connected thereto, as by welding.

The present invention relates generally to miniaturized electronic circuitry and more particularly to a new and improved method for making miniaturized electrical connections which are more compact, more rugged and reliable, and more economical of manufacture and assembly.

This is a continuation of patent application, Ser. No. 445,067, filed Apr. 2, 1965, and entitled "Electrical Connection," now abandoned, which is a divisional application of patent application Ser. No. 134,248, filed Aug. 28, 1961, "Printed Circuit With Integral Welded Tubelets," now Patent No. 3,209,066.

In the field of electronic miniaturization, it has been the general practice to employ printed circuits mounted upon insulating boards, or a plurality of such printed circuit boards in a stacked configuration forming an electronic module package. This has been done in an effort to reduce the amount of space previously required by larger conventional electronic equipment, as well as to significantly reduce the cost of manufacture of such circuits where the older hand-wiring techniques are used. Although such miniaturized electronic devices and assembly techniques have served the purpose, they have not proved entirely satisfactory under all conditions of service.

Considerable difficulty has been experienced with these previous forms of electronic apparatus in that electrical connections made by conventional soldering and eyelet techniques, or even by welding, have not always displayed the requisite degree of resistance to shock, vibration, and thermal stresses. Moreover, the radial reduction in size, especially in recent years, of electronic components used in module construction has greatly enhanced the criticality of space which can be allotted for electrical connections. Therefore, a dire need has arisen for compact and rugged electrical connectors capable of providing more reliable connections to the conductive leads of miniaturized electronic components. In this regard, those concerned with the development of miniature electronic circuits and packaging have long recognized the necessity for such an electrical connector and, in the interest of economy, one which could be easily integrated into circuits with a minimum of cost and effort and which would also enhance the facility with which physical and electrical connections could be made by well-known welding and soldering techniques. Such a miniaturized connector would not only have the much desired and sought for advantages of enhanced rigidity, simplicity, compactness, and reliability of electrical connection, but would also have the economical effect of reducing total circuit assembly time since the skill requirements of personnel performing the assembly process would be substantially reduced along with expensive training time.

A major purpose of this invention, therefore, is to provide a method and means for making electrical connections which embraces substantially all of the advantages of similarly employed connecting means and yet possesses none of the aforedescribed disadvantages. To attain this, the present invention contemplates a unique conductive circuit element, comparable to those used in printed circuits, formed with any desired number of small tube-like projections or bosses having holes therein traversing the length of the bosses. These bosses, which are integral parts of the circuits in which they are embodied, perform the function of rigidly holding the conductive leads of electronic components in firm positions, ready for welding, soldering, or any other form of fusing or coalescing to produce a good physical and electrical contact.

The boss-type connectors of the instant invention have internal dimensions governed by the diameters of the component leads to be connected. Thus, the connector hole sizes can be accurately controlled to provide printed circuit boards for any specific lead size requirements. The boss connectors have the further advantage of being readily formed as a unitary structure together with the circuitry in which they are utilized, in a manner to be hereinafter described, as opposed to the previous conventional use of eyelets in miniaturized circuits. Such eyelets not only must be separately and individually installed, but also require more space than the boss connectors of the present invention.

The connector of the instant invention has additional advantages when used in conjunction with electronic welding techniques, the latter connecting process having come into great favor in recent years. This desirability for welded connections is due to the greater susceptibility of the welding process to accurate control and the resulting enhanced consistency of connection produced by a homogeneous fusion of parent metals having superior resistance to shock, vibration and thermal stresses. Moreover, since heat is applied to the circuit connection for only a few milliseconds during the electronic welding process, thermal stresses induced thereby cause essentially no degradation of adjacent electronic parts.

The electrical connector of the instant invention enhances the existing advantages of welding even further by providing twice the welded area between the connectors and the component leads to be secured thereto, and consequently an anticipated higher reliability of electrical connection, since welding is accomplished directly through the walls of the boss-type connectors to the component leads. Furthermore, because welding is carried out through the tube, critical settings by the welder are not required in order to obtain high strength welds since the welding apparatus may contact the tube anywhere along its outer circumference. In addition, since the welding electrodes contact only one type of metal, namely the surface metal of the boss connector itself, only one set of electrodes is required, governed solely by the welding metal of the connectors, regardless of the materials used for the conductive leads of the electronic components being connected.

Accordingly, it is one object of the present invention to provide a new and improved method and means for making electrical connections.

Another object of the invention is to provide a method and means for making electrical connections resulting in an electrical connection which is both more compact and more reliable.

A further object of this invention is the provision of a method and means for making compact electrical connections with improved conductivity, rigidity, and resistance to vibration.

Yet another object of the instant invention is to provide a new and improved electrical connector which may be economically formed as an integral part of the electrical circuit in which it is to be used.

Still another object of this invention is to provide a method and means for making miniature electrical connections which are more readily and reliably welded by unskilled or semi-skilled personnel.

An additional object of the present invention is to provide an electronic module package having improved electrical connections which reduce the size and assembly time for such packages and yet enhance module strength, rigidity, reliability and accuracy of assembly.

Other objects and many of the attendant advantages of this invention will be readily appreciated as the same becomes better understood by reference to the following detailed description when considered in connection with the accompanying drawings wherein.

Figures 4, 5:
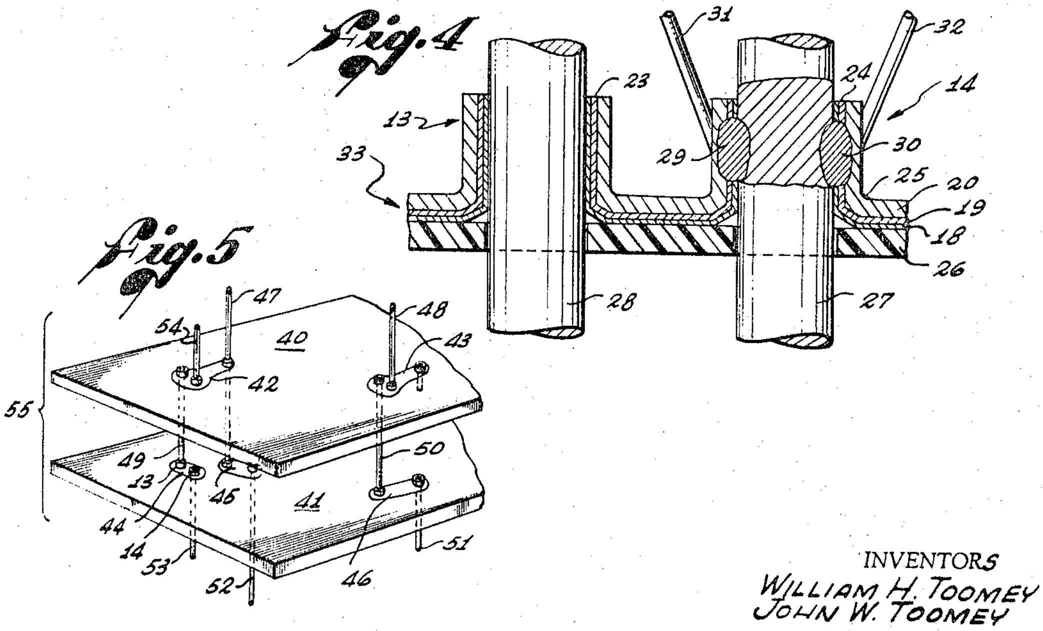
FIGURE 4 is an elevational view, in section, of a printed circuit board utilizing the finished electrical connection means of the instant invention.
FIGURE 5 is a perspective view illustrating a pair of printed circuit boards physically stacked and electrically interconnected by means of the connection means of the instant invention to form a typical electronic module package.

Referring now to the drawings wherein like reference characters designate like or corresponding parts throughout the several views, there is shown in FIGURE 5 of the drawings a portion of an assembled electronic module package 55 utilizing one embodiment of the electrical connection means of the present invention. The electronic module package 55 is shown as comprising a plurality of printed circuit boards, such as the printed circuit boards 40 and 41, which have their respective electrical circuits interconnected by suitable conductive leads, such as the leads 47 through 54, inclusive, and are in stacked physical relationship to one another to form a rigid and compact package. The printed circuit boards 40 and 41 include conductive circuit elements thereon, such as the elements 42, 43, 44 45 and 46. The latter circuit elements 42 through 46, inclusive, incorporate the novel electrical connection means of the instant invention in the form of tube-like projections, hereinafter referred to as boss connectors. These boss connectors are formed integrally and as unitary structures with their respective circuit elements to which the desired electrical connections are to be made.

The circuit element 44 on the printed circuit board 41 of the module package 55 may be considered typical as to structure utilizing the electrical connection means of the present invention. The conductive circuit element 44 has formed integrally therewith two connectors in the form of the bosses 13 and 14. The lead 49 from an electronic component (not shown) is illustrated as passing through the boss connector 13 of the circuit element 44 to a similar electrical connector on the circuit element 42 of board 40 directly above the board 41. Similarly, the conductive lead 53 is physically and electrically connected to the element 44 by means of the integral boss 14.

The leads 49 and 53, passing through the bosses 13 and 14, respectively, may be permanently secured thereto by any suitable means, well known in the electrical arts, such as by welding, soldering, swaging, or staking. In this regard, one feature of the instant invention is its enhancement of the facility with which electronic welding techniques may be utilized in making electrical connections. This feature of the invention is particularly valuable, as previously pointed out, in view of the fact that the welding technique is rapidly becoming the most desirable method of forming reliable electrical connections. However, the new and improved method and means of making electrical connections disclosed herein is to be considered in no way limited solely to welding processes, and is readily adaptable to any of the electrical connection expedients presently used in the electrical arts, without in any way departing from the spirit and scope of the instant invention.

It should be noted that the electrical connections formed in accordance with the instant invention may be used to produce electronic module packages, such as the module package 55, in which the rigidity of structure, reliability of electrical connection, resistance to shock, economy of manufacture, and accuracy of assembly are substantially enhanced over miniaturized circuit forming techniques previously employed in the electrical arts. For example, the former method of using eyelets for making electrical connections in printed circuits required separate installation of each eyelet, in itself a costly time consuming process when compared with the integrally formed boss connector and circuit element of the instant invention. Furthermore, eyelets not only require considerably more space for the finished electrical connection than connections made in accordance with the present invention, but eyelets also lend themselves less readily adaptable to improved welding techniques, as well as produce connections lacking the rigidity and reliability of connections formed in accordance with the instant invention.

As previously indicated, a primary feature of the present invention, in addition to the superior quality of the electrical connections formed thereby, is the economy and ease of manufacture of the novel and inventive electrical connectors, by virtue of the fact that these connectors are formed as integral unitary structures with the circuits in which they are employed Therefore, referring now particularly to FIGURES 1 through 4 of the drawings, there is illustrated therein a typical sequence of operations in making and using the electrical connection means of the instant invention.

Figure 1:
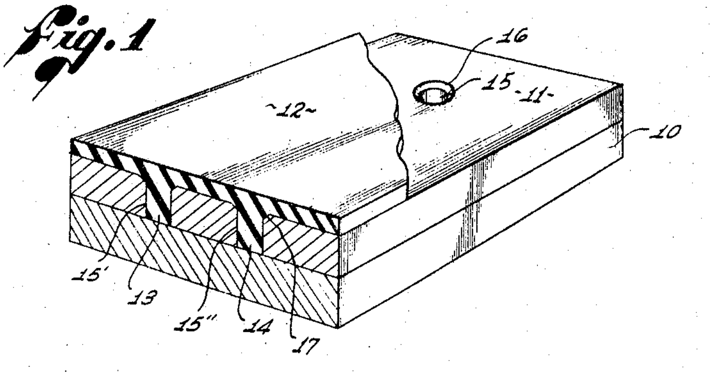
FIGURE 1 is a perspective view, partly in section, of a molding apparatus for forming a base member used in the manufacture of the electrical connector of the instant invention, portions being broken away.

FIGURE 1 depicts the mold forming operation in the production of the electrical connectors of the instant invention formed integrally and as a unitary structure with the circuit elements in which they are embodied. In this regard, there is shown a female tooling mold 11, of any suitable mold material, such as steel, aluminum or the like, which is suitably prepared to incorporate a plurality of holes therein, such as the holes 15, 15' and 15''. The location and diameter of each of these holes is selected in accordance with the desired location of the electrical connectors in the requisite circuit elements and the size of the leads to be received and connected thereto. In this regard, hole selection and preparation of the mold 11 in accordance therewith may be accomplished by automatic machinery under the control of an appropriate programming system. The holes in the female mold 11 are countersunk or otherwise suitably processed to provide internal fillets, such as the fillet 16 for the hole 15 and the fillet 17 for hole 15″, to avoid sharp corners and insure uniform coating thickness in accordance with preferred plating practice in the production of printed circuits.

A molding material is placed in contact with the female tooling mold 11, by any suitable process such as pouring or pressing or the like, to provide a male mold base member 12 upon which circuit elements may be subsequently plated. The material for the male base member 12 may be any suitable flexible plastic or rubber-like molding material, such as silicone rubber or the like, which possesses the desired degrees of mold conforming fidelity and mold releasing quality. The base member 12 is thus molded with a plurality of bosses, such as the bosses 13 and 14 in FIGURE 1, corresponding in sizes and locations with the desired sizes and positions of the electrical connectors to be subsequently provided. The height of the bosses 13 and 14 is determined by the thickness of the plate used for the mold 11. A second plate 10 is used to limit the flow of the molding material for the member 12 through the holes 15, 15′ and 15″ in the mold 11.

Figure 2:
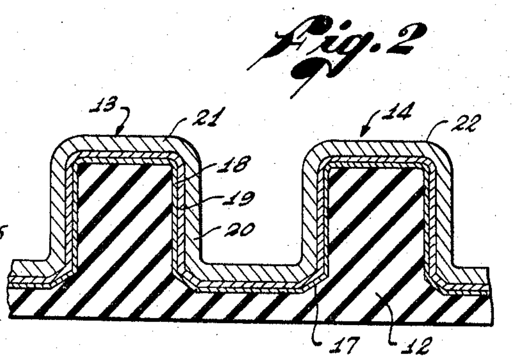
FIGURE 2 is an elevational view, in section, through the male base member of FIGURE 1 following the depositing of conductive layers thereon.

FIGURE 2 of the drawings illustrates the male base member 12, removed from the female tooling mold 11, and depicts in cross-section a plurality of conductive layers 18, 19 and 20, coated on the base member 12 by a method to be subsequently described. These layers, 18, 19 and 20, provide the desired conductive circuit pattern integrally formed with the similarly and simultaneously coated bosses 13 and 14. As shown in FIGURE 2, all portions of the bosses 13 and 14, at this stage of the process, are completely coated and therefore have end caps 21, and 22, respectively.

Figure 3:
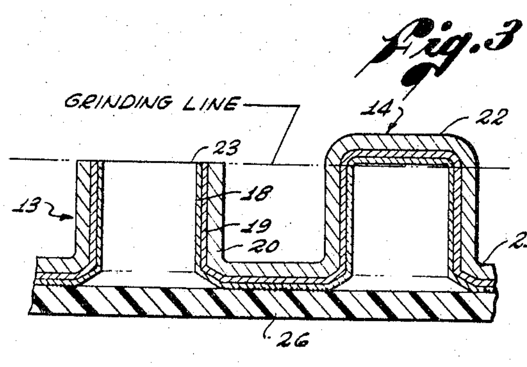
FIGURE 3 is a sectional view, in elevation, of the structure of FIGURE 2, illustrating subsequent operations in the manufacture of the instant invention.

FIGURE 3 illustrates the structure of FIGURE 2 modified by removal of the male base member 12 and mounting of the remaining formed conductors upon an electrically insulating circuit backing layer 26 of fiberglass, phenolic resin, or the like. The formed conductors may be attached to the backing layer 26 by any suitable adhesive material. Plated fillets, such as the fillet 25 of the boss 14, add strength to the boss connectors 13 and 14.

As shown in FIGURE 3, the cap 21 of the boss 13, previously shown in FIGURE 2, has been removed by any suitable grinding or shearing process, to provide an open end 23 enabling a connecting lead to pass into the boss 13. The cap 22 of the boss 14 is destined to be likewise removed for the same purpose. Subsequent processing provides holes in the backing layer 26, in central alignment with the holes in respective bosses, to enable component leads to pass through the printed circuitry for ready connection thereto.

FIGURE 4 illustrates a printed circuit board 33 utilizing the unitary boss connectors 13 and 14 formed integrally with the circuit structure and attached to the insulating backing layer 26. The backing layer 26, previously illustrated in FIGURE 3 without holes, has been punched to provide the necessary holes corresponding to the locations of the boss connectors, such as 13 and 14, to receive conductive leads, such as the leads 27 and 28. The coated end caps 21 and 22 have been removed from the boss connectors 13 and 14, respectively, by appropriate machining methods to provide open connector end 23 and 24, respectively.

Permanent connection of the leads 27 and 28 into the printed circuit board 33 may next be accomplished. In the embodiment illustrated in FIGURE 4, welding is utilized to physically and electrically connect the lead 27 into the circuit of the board 33 through the boss connector 14. As shown in FIGURE 4, the jaws 31 and 32 of an electric welder are applied to the exterior surface of the boss 14 and welding is accomplished directly through the tubular walls of the boss.

The connectors of the instant invention provide several advantages in regard to welding techniques. First, because of the extended surface area in contact with the boss connector 14 and the lead 27, approximately twice the welded area is obtained. Obvious advantages of physical rigidity and electrical reliability ensue. The nugget welds 29 and 30, depicted in FIGURE 4 and formed by fusing the material of the boss connector 14 with that of the conductive lead 27, are brought about, as previously indicated, by welding directly through the walls of the boss. This welding procedure has several advantages since the welding jaws 31 and 32 may be placed anywhere on the outer surface of the boss 14, and hence, a critical setting of the welder is not required in order to obtain a high strength weld. This, in turn, greatly reduces the skill requirements of the welder in the assembly process, thus reducing attendant expensive training time. Furthermore, since the welding jaws or electrodes contact only one type of material, namely the exterior surface material of the boss itself, only a single set of welding jaws is required for any given material of the boss connector, regardless of the material used for the component leads.

There is also shown in FIGURE 4 the conductive lead 28 passing through the insulating backing layer 26 and the boss connector 13, prior to permanent connection into the circuit of the printed circuit board 33. However, although welding has been illustrated as a desirable form of connection, it is to be understood that other techniques, such as soldering, swaging, or staking may be just as readily employed in securing leads, such as the lead 28, into the circuit.

Figure 6:
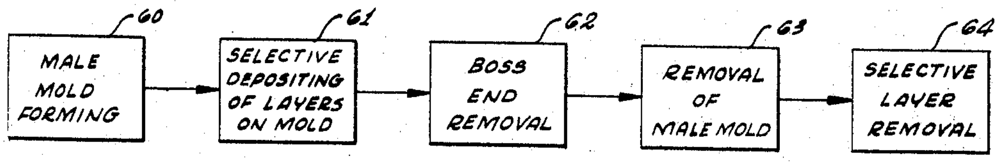
FIGURE 6 illustrates, by block diagram, one method of forming individual electrical connection means in accordance with the instant invention.
Figure 7:
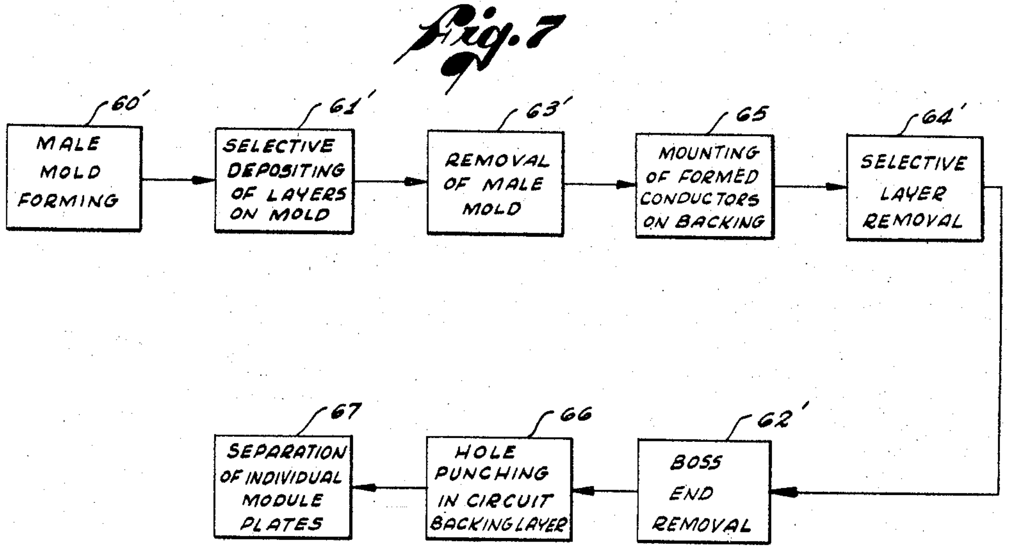
FIGURE 7 is a block diagram depicting one method for forming a complete printed circuit board utilizing the electrical connection means of the present invention.

FIGURE 6 of the drawings illustrates one method of forming individual circuit elements incorporating the connection means of the instant invention, whereas FIGURE 7 depicts a method of forming complete printed circuit boards in accordance with the present invention.

Referring now to FIGURE 6 of the drawings, there is illustrated, by block diagram, the basic steps, some of which have been previously described herein, in forming the boss-type electrical connector of the instant invention as a unitary structure with the circuit element in which it is to be utilized.

The male mold formation step 60 relates to the forming of the male base members 12, shown in FIGURE 1 of the drawings, through the use of a suitable molding material, such as silicone rubber or the like, in conjunction with the plate 10 and the previously formed female tooling mold 11 having holes or recesses therein in accordance with the desired location and characteristics of the boss connectors to be formed by subsequent operations.

Step 61 relates to the selective depositing of conductive layers upon the male base member 12 after removal from the tooling mold 11 of FIGURE 1. In this regard, the number of layers of coating material applied to the male base member 12, as well as the specific materials used for these layers, depends largely upon the specific circuit applications for which the particular circuit elements and combined boss connectors are intended. Any suitable methods, well known in the art, for manufacturing circuit elements of the printed circuit type may be utilized for step 61. Examples of suitable methods are the material removal processes, film deposition processes, mold and die processes, etc., set forth in vol. 10 of the McGraw-Hill Encyclopedia of Science and Technology, 1960, pages 594–597.

By way of illustration, however, a coating process will be described for producing a unitary structure of a printed circuit element and requisite electrical connectors, in accordance with the instant invention, which has particular application where welding techniques are to be subsequently used. In this instance, a desirable electrical connector would be one in which the circuit element and the boss connectors are formed substantially of a material having desirable welding characteristics, such as stress-free nickel. In this regard, therefore, the layers of coating material 18, 19 and 20, depicted in FIGURES 2, 3 and 4 of the drawings, could be silver, copper, and nickel, respectively.

To provide such a circuit arrangement, a thin layer of silver 18 is first applied to the male base member 12 by any well-known process, such as by electroless deposition or "silvering." The silver layer 18 provides a conductive base for electroplating thereon a thin layer of copper 19.

A photographic technique may then be used for selectively plating a coating of nickel 20 over the copper layer 19 in accordance with the desired circuit pattern. The desired results may be accomplished by first coating the entire copper layer 19 with a suitable photographically sensitive resist material, and then projecting an image of the desired circuit configuration upon the layer of photo-resist material. The latter is then developed by conventional photographic methods to produce a plate in which the photo-resist material remains over all but those portions of the copper plating which are intended to receive a layer of nickel. This is followed by the nickel coating step which may be carried out by any suitable means, such as by electrolytic deposition.

The selective depositing of layers 18, 19, and 20 is followed by step 62 which consists of removing the end caps of the boss connectors so as to enable the conductive leads of components to pass therethrough, following subsequent removal of the base member 12. End cap removal may be accomplished by merely grinding the end cap, such as the cap 22 in FIGURE 3 of the drawings, from one end of the boss 14.

The boss end cap removal step 62 is followed by step 63 in which the unitary structure of the printed circuit and its associated boss connectors integral therewith is removed from the male base member 12. In most instances, the latter may be accomplished merely by peeling the formed conductors directly off the base member 12.

The last step 64 involves the removal of extraneous coating material to leave a resultant product consisting solely of the conductive circuit elements and their integrally formed boss connectors. In this regard, the remaining photo-resist material is removed by means of a suitable stripping solution, whereas the undesired copper and silver layers may be readily removed by appropriate etching solutions. At this point, the unitary structure of the combined electrical connector and circuit element is complete. A great plurality of such circuit elements may be manufactured at one time, the number being limited solely by the physical dimensions of the molded male base member 12.

FIGURE 7 of the drawings illustrates a variation of the method shown in FIGURE 6 in which an entire printed circuit board, utilizing the electrical connection means of the instant invention, is produced as the finished product. Steps 60′, 61′ and 63′ in FIGURE 7 correspond, respectively, to steps 60, 61 and 63 in FIGURE 6.

Step 65 involves the mounting of the formed conductors, following removal of the male base member 12, upon a suitable insulating backing layer, such as the layer 26 in FIGURES 3 and 4 of the drawings. Any suitable adhesive material may be utilized to accomplish the latter.

Step 64′, involving the removal of undesired portions of the coating materials, corresponds to step 64 of FIGURE 6, whereas step 62′, pertaining to the boss end cap removal, corresponds to step 62 of FIGURE 6.

Step 66 involves the punching of holes in the insulating backing layer 26 to correspond with the central holes passing through the boss connectors in the printed circuit. Proper alignment for carrying out the latter hole punching procedure is accomplished by means of a suitable alignment jig.

Step 67 involves the separation, by simple shearing or other like means, of the resultant printed circuit board into individual circuit module plates, where a large backing layer 26 has been utilized and more than one circuit has been attached thereto. The resultant module plates may thereafter be assembled, by means of a suitable jig arrangement, into a compact electronic module package such as that depicted and previously described in connection with FIGURE 5 of the drawings.

The embodiment of the invention shown in FIGURES 2, 3 and 4, using layers of silver, copper and nickel, respectively, should in no way be considered as limiting the invention to these particular coating materials. Although the disclosed embodiment, utilizing the aforementioned coating materials, is particularly suitable to welding techniques for making electrical connections, the resultant structure may be gold flashed to enhance its soldering capabilities, or, if soldering is originally intended as the desired method of electrical connection, the nickel coating may be dispensed with entirely.

As previously indicated, the choice of nickel as an outer conductive layer is due to the desirable welding characteristics of nickel. Therefore, referring again to FIGURE 4 of the drawings, it should be pointed out that, in actual practice, the thin silver layer 18 inside the boss connector 14 is usually removed merely by the frictional engagement of passing conductive lead 27 through the connector 14. Moreover, during the welding process, the outer nickel layer 20 fuses with the material of the conductive lead 27 right through the thin copper layer 10, so that good electrical and mechanical contact is made directly to the outer nickel layer. Of course, if desired, the order of steps 64′ and 62′ in FIGURE 7 of the drawings may be interchanged. In this instance, the sliver and copper layers within the boss connectors will be removed during the etching process for removing these layers from other portions of the formed conductors.

The boss-type electrical connectors of the instant invention, formed integrally and as a unitary structure with conductive circuits in which they are embodied, satisfy a long existing need in the art of miniaturized electronics for rugged and electrically reliable connectors which are compact, economical, and easy to manufacture and assemble in the finished product.

Obviously, many modifications and variations of the present invention are possible in the light of the above teachings. It is therefore to be understood, that within the scope of the appended claims, the invention may be practiced otherwise than as specifically described.

What is claimed is:

1. The method of making circuit elements, embodying improved electrical connectors therein, comprising the steps of:

molding a base member into a shape having a plurality of readily deformable resilient bosses thereon corresponding with the desired size and location of said electrical connectors on said circuit elements;

coating said base member and at least a portion of said bosses with a thin layer of silver;

coating said base member and at least a portion of said bosses with a thin layer of copper over said silver;

coating said base member and at least a portion of said bosses with a layer of nickel over said copper only in those areas corresponding to the desired circuit pattern;

removing the coated ends of said bosses;

separating said base member from said circuit elements by resiliently changing the form of said base member; and selectively removing undesired coating material from said circuit elements.

2. A method of making a printed circuit comprising a nonconducting board supporting a pattern of electrical conductors and a plurality of electrically interconnected upstanding hollow cylindrical tubelets projecting away from the board and of sufficient strength to be self-supporting and to provide rigid support for accommodating and supporting electrical leads inserted into and weldable therein, including the steps of:

providing a removable mold having a plurality of cylindrically shaped supporting portions spaced from one another and each of sufficient length greater than the tip portion of a circuit welding electrode;

plating conducting metal onto said mold portions along their length to simultaneously form projecting portions of said tubelets;

said plating of conducting metal including electroplating a sufficient quantity of weldable metal forming the walls of said tubelets of sufficient thickness, strength, and rigidity to be self-supporting in the absence of the mold and additionally of such strength and rigidity to provide upstanding supports for accommodating and holding electrical leads therein;

removing the mold to provide the plurality of unsupported spaced projecting tubelets;

concurrently with the plating of the plurality of tubelets, plating additional conductive material to provide electrical interconnection of the tubelets;

providing said electrical interconnected plated tubelets on said board and secured to the board so that the hollow projecting portions thereof are self-supporting and extend outwardly away from the surface of the board for a distance greater than the tip portion of a circuit welding electrode;

inserting a lead into the interior of at least one of said tubelets and into the projecting portion thereof away from the surface of the board, whereby the length of said tubelet provides a support for said lead along the length of the tubelet;

and welding said lead within said tubelet employing an electrode space beyond the surface of said board for welding the lead and tubelet.

3. In the method of claim 2, said weldable metal being nickel.

4. In the method of claim 2, the plating of metal including plating plural layers of metal.

5. In the method of claim 2, the hollow tubelets being provided in registry with openings through said board.

References Cited

UNITED STATES PATENTS

| | | | |
|---|---|---|---|
| 2,100,333 | 11/1937 | Hess. | |
| 2,200,059 | 5/1940 | Coyne. | |
| 2,684,421 | 7/1954 | Hipple | 29—630 XR |
| 2,948,051 | 8/1960 | Eisler. | |
| 2,955,351 | 11/1960 | McCreadie | 29—625 |
| 3,013,188 | 12/1961 | Kohler | 29—625 XR |
| 3,024,151 | 3/1962 | Robinson | 156—150 |
| 3,083,261 | 3/1963 | Francis et al. | 174—88 |
| 3,159,906 | 12/1964 | Telfer | 29—626 |
| 3,187,606 | 6/1965 | Ohmtrop | 29—625 XR |
| 3,213,325 | 10/1965 | Lindstrand | 26—626 XR |
| 1,361,075 | 12/1920 | Larson. | |
| 2,288,348 | 6/1942 | Funk. | |

JOHN F. CAMPBELL, *Primary Examiner.*

R. W. CHURCH, *Assistant Examiner.*

U.S. Cl. X.R.

174—68.5; 317—101; 29—527, 528, 529; 219—117, 59; 204—15, 14; 117—212, 215

UNITED STATES PATENT OFFICE
CERTIFICATE OF CORRECTION

Patent No. 3,434,208 March 25, 1969

William H. Toomey et al.

It is certified that error appears in the above identified patent and that said Letters Patent are hereby corrected as shown below:

Column 10, line 1, "space" should read -- spaced --.

Signed and sealed this 21st day of April 1970.

(SEAL)
Attest:

Edward M. Fletcher, Jr.
Attesting Officer

WILLIAM E. SCHUYLER, JR.
Commissioner of Patents